(12) United States Patent  
Foegelle

(10) Patent No.: US 8,412,112 B2
(45) Date of Patent: *Apr. 2, 2013

(54) SYSTEMS AND METHODS FOR SIMULATING A MULTIPATH RADIO FREQUENCY ENVIRONMENT

(75) Inventor: Michael Foegelle, Cedar Park, TX (US)

(73) Assignee: ETS-Lindgren, L.P., Cedar Park, TX (US)

( * ) Notice: Subject to any disclaimer, the term of this patent is extended or adjusted under 35 U.S.C. 154(b) by 245 days.

This patent is subject to a terminal disclaimer.

(21) Appl. No.: 12/773,473

(22) Filed: May 4, 2010

(65) Prior Publication Data

US 2010/0285753 A1    Nov. 11, 2010

Related U.S. Application Data

(60) Provisional application No. 61/215,526, filed on May 6, 2009, provisional application No. 61/268,168, filed on Jun. 8, 2009.

(51) Int. Cl.
*H04B 17/00* (2006.01)
(52) U.S. Cl. ............... 455/67.12; 455/67.11; 455/67.16
(58) Field of Classification Search ............... 455/67.11, 455/67.12, 67.16, 115.1, 226.1, 423
See application file for complete search history.

(56) References Cited

U.S. PATENT DOCUMENTS

| | | | |
|---|---|---|---|
| 5,530,412 A | 6/1996 | Goldblum | |
| 5,794,128 A | 8/1998 | Brockel et al. | |
| 6,308,072 B1 | 10/2001 | Labedz et al. | |
| 6,571,082 B1 | 5/2003 | Rahman et al. | |
| 6,687,650 B2 | 2/2004 | Hatanaka et al. | |
| 6,771,226 B1 * | 8/2004 | Dujmovic | 343/797 |
| 6,993,069 B1 * | 1/2006 | Donati et al. | 375/224 |
| 7,035,594 B2 * | 4/2006 | Wallace et al. | 455/67.12 |
| 7,119,755 B2 * | 10/2006 | Harvey | 343/785 |
| 7,280,466 B2 * | 10/2007 | Tong et al. | 370/208 |
| 7,286,802 B2 | 10/2007 | Beyme et al. | |
| 7,508,868 B2 * | 3/2009 | Chang | 375/224 |
| 2003/0236089 A1 | 12/2003 | Beyme et al. | |
| 2006/0194553 A1 | 8/2006 | Ozaki et al. | |

* cited by examiner

*Primary Examiner* — Tuan H Nguyen
(74) *Attorney, Agent, or Firm* — Christopher & Weisberg, P.A.

(57) ABSTRACT

Embodiments include systems and methods for simulating a multipath environment for testing a device. In one embodiment, a plurality of antennas are placed around a device under test in an anechoic chamber. Each of a plurality of the antennas is connected to a path of a variable path simulator capable of generating multiple paths between the antennas and external wireless communication test equipment. The variable path simulator introduces a delay spread into each path. In this way, a multipath environment is simulated with signals appearing to arrive from different angles and different distances. Each of a plurality of antennas may be adapted to produce substantially plane waves at the device under test.

19 Claims, 9 Drawing Sheets

SYSTEMS AND METHODS FOR SIMULATING A MULTIPATH RADIO FREQUENCY ENVIRONMENT

PRIORITY

This application is a non-provisional application that claims priority of provisional U.S. Patent Application No. 61/215,526 filed on 6 May 2009, which provisional application is incorporated herein by reference. This non-provisional application further claims priority of provisional U.S. Patent Application No. 61/268,168 filed on 8 Jun. 2009, which provisional application is incorporated herein by reference.

FIELD

The written description is in the field of radio frequency (RF) measurements.

BACKGROUND

Over the air (OTA) performance testing of active wireless devices has become an important part of evaluation and certification criteria. Existing test methodologies are extensions of traditional antenna pattern measurement techniques. A critical assumption of these methods is that the device under test utilizes a single active antenna. Advances in wireless technology continue to incorporate more complex antenna systems, starting with simple switching diversity and progressing to more advanced concepts such as adaptive arrays (smart antennas) and multiple-input multiple-output (MIMO) technologies. These technologies combine multiple antennas with various software algorithms that can dynamically change the behavior of the antennas during the test, negating the assumption that each position and polarization of an antenna pattern measurement represents a single component of the same complex field vector. In addition, MIMO technologies rely on the multipath interaction and spatial relationship between multiple sets of antennas. An anechoic chamber with a single measurement antenna cannot simulate the environment necessary to evaluate the performance of a MIMO system. New measurement methods and system technologies are needed to properly evaluate these technologies.

BRIEF DESCRIPTION OF THE DRAWINGS

Aspects of embodiments will become apparent upon reading the following detailed description and upon reference to the accompanying drawings in which like references may indicate similar elements.

DETAILED DESCRIPTION OF EMBODIMENTS

Figure 1:
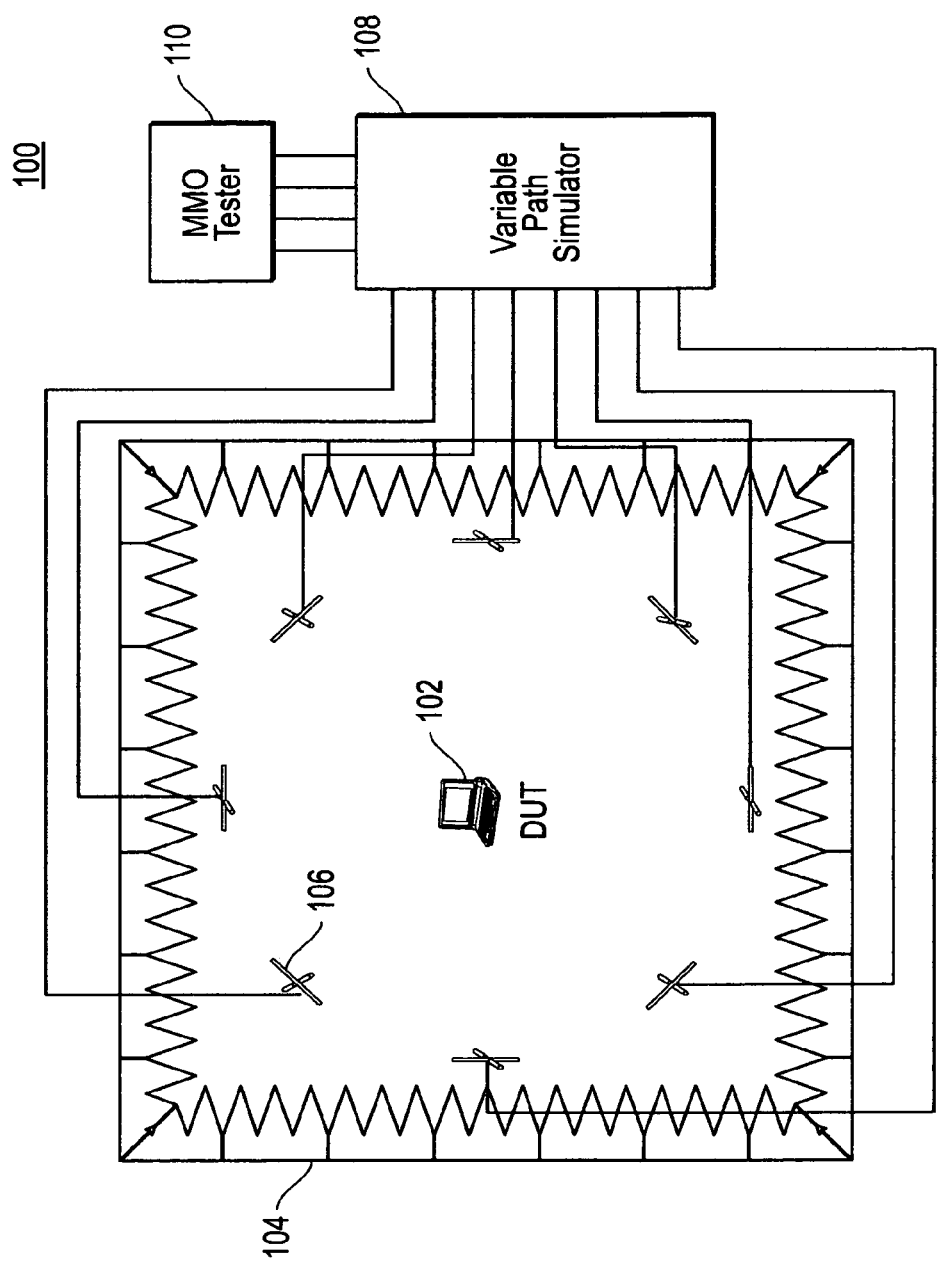
FIG. 1 depicts an embodiment for simulating multipath in an anechoic chamber.

The following is a detailed description of embodiments depicted in the accompanying drawings. The amount of detail offered is not intended to limit the anticipated variations of embodiments; but, on the contrary, the intention is to cover all modifications, equivalents, and alternatives falling within the scope of the appended claims. The detailed descriptions below are designed to make such embodiments obvious to a person of ordinary skill in the art.

This application incorporates herein by reference, U.S. patent application Ser. No. 11/810,965 filed on 7 Jun. 2007. This application also incorporates herein by reference, U.S. patent application Ser. No. 11/880,867 filed on 24 Jul. 2007.

Embodiments include systems and methods for simulating an RF environment. In particular, embodiments include systems and method for simulating an artificial multipath environment exhibiting real world multipath conditions. In one embodiment, a plurality of antennas are placed around a device under test in an anechoic chamber. Each of a plurality of the antennas is connected to an RF port of a variable path simulator capable of generating multiple paths between the antennas and external wireless communication test equipment. The variable path simulator introduces different delay spreads into each path. In this way, a multipath environment is simulated with signals appearing to arrive from different angles and different distances. Each of a plurality of antennas may be adapted to produce substantially plane waves at the wireless device under test.

The wireless communication systems described and discussed herein are intended to represent any of a wide variety of wireless systems which may include without limitation, NFC (Near Field Communications), WPAN (Wireless Personal Area Network), WLAN (Wireless Local Area Network), WMAN (Wireless Metropolitan Area Network), WiMAX (Worldwide Interoperability for Microwave Access), 2.5-3G (Generation) cellular, 3G RAN (Radio Access Network), 4G, RFID (Radio Frequency Identification), etc.

Today's wireless OTA performance testing expands on traditional spherical antenna pattern measurement techniques by performing absolute power and sensitivity measurements of active devices. These methodologies incorporate scanning processes to measure the radiation pattern over the surface of a sphere. The critical assumption is that the device's radiation pattern remains unchanged during the time required to scan the entire surface of the sphere. Previously, the only time based concern has been amplifier drift and weakening battery of the active device.

However, now a variety of wireless technologies are adopting a range of adaptive antenna technologies, starting with simple switching diversity and extending to more advanced technologies such as adaptive arrays (smart antennas) and multiple-input multiple-output (MIMO) technologies. It can be shown that allowing these devices to adapt during an OTA performance test can easily invalidate the test result. However, given that many of these adaptive technologies provide a significant performance improvement in actual use, the question becomes how do we determine this performance improvement if the adaptive functionality is disabled? Ways must be found to either test these devices in full operation in a test environment that replicates realistic operation, or to use the existing test methods with custom test modes in order to numerically determine the resulting total performance.

Note that the majority of this discussion will reference only one propagation direction in the test system (i.e. from the measurement antenna to the device under test (DUT)) but all descriptions may also refer to a bi-directional link that may work the same in both directions.

Antenna diversity is a technology that has always been used heavily in 802.11 devices and has become more prevalent in mobile phone and other WMAN mobile device designs. While there are a number of different implementations of diversity, such as switching diversity and maximal ratio combining, the basic concept is to improve link performance by using more than one antenna separated by some significant portion of a wavelength. As the name implies, switching diversity attempts to overcome the effects of nulls due to multipath fading by switching to whichever antenna performs better. It should be apparent that if a device under test (DUT) has two antennas mounted orthogonal to each other (polarization diversity) then the orientation of the device in the measurement system will change the measurement result.

FIG. 1 shows an embodiment 100 for multipath testing of a device under test (DUT) 102 that has multiple antennas. An object of a test may be to measure the performance of the antenna and radio system of the DUT 102 in an environment that simulates multipath propagation. The DUT 102 may be any device for which over the air performance in a multipath environment is to be evaluated. This may be a device capable of MIMO reception and transmission, adaptive beamforming, and/or antenna diversity. A set of antennas 106 surround the DUT 102 within an anechoic chamber 104. The figure shows a plurality of antennas, each one capable of dual polarization, in some embodiments. Each antenna 106 may receive and/or transmit signals to simulate propagation of energy from a particular angle. Each of antennas 106 may be connected to a variable path simulator 108. Each antenna may connect to a different path of the variable path simulator 108. Each polarization of a dual polarized antenna may be connected to an equivalent port of the variable path simulator 108 with a different magnitude and/or phase relationship to simulate any desired polarization, including linear polarization of any orientation, or right- or left-hand circular or elliptical polarizations with any desired statistical distribution. The variable path simulator 108 may introduce a user-specifiable delay spread into each path. The delay spread introduced into each path may be different. In this way, with antennas 106 disposed at various angles around the DUT 102, and with different path lengths introduced by the variable path simulator 108, one may simulate a variety of real world multipath environments. That is, one may simultaneously simulate reflections and interference from various angles at various distances.

Connected to the variable path simulator 108 is a communication tester 110. The communication tester 110 may emulate a wireless transceiver at an opposite end of a wireless RF link, and may measure either transmitter or receiver performance of the DUT 102 through the variable path simulator 108. The communication tester 110 may also introduce interference signals along one or more of the paths provided by the variable path simulator 108 and the measurement antennas 106 in order to determine the response of the DUT 102 to interfering signals arriving from a given direction. Note that in this context, the communication tester 110 may be implemented in one box or be comprised of a variety of test equipment components required to perform testing of the DUT 102. Said testing may even be performed using "off-the-shelf" base stations, access points, clients, or other components.

A 4 spatial-channel MIMO communication tester is shown in FIG. 1, but is not the only possible communication tester implementation. It is important to understand the difference between the N different spatial paths, which are simulated by antennas 106 and the variable path simulator 108, and the MIMO channels emulated by the communication tester 110, which emulates a transmitter/receiver with M spatial channels. In this implementation, the N spatial paths combine into M spatial channels through the variable path simulator 108. Conversely, the M spatial channels split into N spatial paths. This can be done passively using combiners/splitters, or can be done actively in electronics. In some embodiments, M may be equal to N.

Thus, embodiments enable a user to simulate real world multipath environments. One embodiment is a test system for simulating a multipath RF environment. The test system comprises a plurality of antennas disposed at various angles around a device under test within an anechoic chamber. Each of the plurality of antennas may be adapted to produce substantially plane waves at the DUT, which may be a wireless device such as a laptop computer or a mobile phone, for example. The test system also comprises a variable path simulator with different paths connected to different ones of least a plurality of the antennas to introduce a delay spread in each path connected to an antenna. The angles of the antennas and the delays introduced by the variable path simulator enable simulation of simultaneous reflections at different angles and distances.

The variable path simulator may be implemented using passive devices. Or, it may comprise circuitry to simulate the separate paths and allows a user to specify a delay spread in each path. Indeed, a user interface may be provided that enables the user to program which antennas to use and what delay spread to insert in each path of the variable path simulator. Thus, a user may experiment to investigate different delay spreads at different angular spreads. Existing channel models used for evaluating wireless device performance in conducted testing can be adapted to separate out various reflection clusters to different propagation paths in order to simulate arrival of those reflections from different directions. This allows determination of how the directional performance of the DUT's antenna(s) affect overall performance.

One or more of the antennas may exhibit dual polarization. In some embodiments, the device under test may be mounted on a rotating pedestal to enable testing at more angles. Also, during a test, at least one antenna may be repositioned to change the geometry of the test. The goal of such positioning is to allow determining the average performance in all directions around the device by changing the direction of communication signals relative to the device. Note that the antennas can be equally disposed around the device under test or placed in any geometric configuration desirable to allow simulation of more complex environmental conditions. Thus, FIG. 1 shows a two dimensional configuration, but three-dimensional configurations are envisioned. In addition, in some embodiments, the anechoic chamber may only partially be lined with absorber in order to introduce additional reflective paths.

A given test would not necessarily use all of the available measurement antennas simultaneously, but could simulate any range of directions and magnitudes for the test. It's then up to the antennas of the DUT to combine those signals in whatever manner they would in a real world RF environment. The DUT may still need to be moved in relationship to the antenna array to cover a full spherical pattern, and it may even be desirable to move the array antennas relative to each other. However, with a sufficient number of array antennas, the directional resolution should be sufficient that any desired configuration can be evaluated by just switching between antennas.

Varying polarization direction from each of the active antennas adds another degree of freedom. Through the use of dual polarized antennas connected to different ports of a path simulator, signals can be generated such that simulated reflections arriving at different times (i.e. from different reflectors) could have different polarization orientations as well. By varying the magnitude and phase relationship of the signals applied to each element of the dual polarized antenna, any combination of linear, elliptical, or circularly polarized waves can be generated with any desired orientation.

Note that this system should not be confused with those multi-sensor systems currently on the market. Those systems only use one sensor at a time, while this concept uses multiple antennas and polarizations simultaneously to create multipath propagation similar to that seen in the real world.

As the usefulness of such a system becomes clear, there are certain questions that arise related to its application. For example, the system could be probing various portions of the pattern simultaneously, so the definition of Total Radiated Power (TRP) and Total Isotropic Sensitivity (TIS) becomes questionable. However, by treating the received signal as a combination of the direct and reflected signals from a known virtual source, we have simply superimposed an environmental channel model on top of the performance of the DUT. In traditional link budgets, TRP and TIS serve as endpoints that give an average performance metric across all propagation directions. That information must be coupled with the appropriate environmental model (free-space Friis equation or Rayleigh or Rician fading) and fading desensitization information to determine actual end-to-end performance. In this case, the DUT would be tested under different multipath models to determine an average performance in each possible environment. The fading characteristics of the environment would already be incorporated into the TRP/TIS.

This system would also allow more dynamic testing of smart antenna systems, since both multipath behavior and response to outside interference could easily be evaluated. Many of the issues described for diversity systems are also overcome using such a system. In evaluating the behaviors being tested by this system, it becomes apparent that it may also be useful even for Single Input Single Output (SISO) testing. Current active tests only deal with magnitude patterns and average power performance. Thus, little is known about the way these devices combine multipath signals into the resultant decoded signal. This system could allow testing the finished device's response to a multipath environment and how other objects (near-field phantoms) around the device change that response.

Thus, one embodiment is a method of simulating a multipath environment. The method comprises placing antennas at various angles around a device under test within an anechoic chamber. Each of a plurality of the antennas may be adapted to produce substantially plane waves at the wireless device. The method further comprises connecting at least a plurality of the antennas to a variable path simulator to introduce a delay in each path connected to an antenna. The antennas receive or transmit spatially separate signals that propagate through the separate paths of the variable path simulator to simulate reflections at different angles and distances. In one embodiment, a path with a least amount of delay may be employed as a reference path that simulates a direct path between the DUT and the communication tester.

The method previously described involves surrounding the device under test (DUT) with a plurality of antennas in an anechoic chamber, connected to multiple path simulators (electronic channel emulators or attenuated delay lines being examples of such). This matrix of antennas is used to simulate angle of arrival (for diversity or receive MIMO/beam forming) or departure (transmit MIMO/beam forming) for various reflections and signals that would normally be found in a real world or modeled environment. The goal of the system is for the volume within the matrix of antennas to replicate the RF signals that would be seen around the DUT in the targeted environment. The external path simulators then simulate the remaining signal paths between the DUT and the test equipment simulating the other end of the wireless link.

The techniques described herein should be able to replicate the conditions produced by any real or conceptual environment. However, without adapting the antennas to produce substantially plane waves at the DUT, the technique would be limited by the available equipment used to create the simulated environment. One such limitation is in the physical characteristics of the antennas typically used to perform OTA measurements. For metropolitan area networks, the environments to be simulated will typically contain signal paths that are hundreds of meters to kilometers in length. Sources or reflections that are any significant distance from the DUT will result in signals reaching the DUT in the form of substantially plane waves. For the purpose of this discussion, substantially plane waves are considered to have substantially uniform signal strength and a substantially constant phase relationship across the volume of the DUT. In such a case, the signal strength of a single source or reflection as seen by the multiple antennas of the DUT will have nearly identical magnitudes, but potentially different phase with respect to each other, due to the different positions of the antennas on the DUT. In trying to simulate this environment, the effect of the long path length can easily be calculated in order to determine the required signal strength and phase relationship at the DUT. The calculations can even compensate for the gain of the antenna used to generate the signal in the test environment and the path loss between the antenna and some point on the DUT. However, once this properly determined signal is fed through a typical antenna, the resulting radiated wave may not match the desired plane wave characteristics that the simulation attempts to replicate, unless the antennas are adapted to produce substantially plane waves.

This disclosure describes a number of structures capable of producing substantially plane waves at the DUT.

In one embodiment, a one or two dimensional array of broadband or narrowband antennas may be fed so as to produce a near planar wave front across the desired test volume. The array may comprise single or dual polarized antennas. In a particular illustrative embodiment, a horn or other directional antenna with a dielectric lens or an appropriate reflector (parabolic, etc.) is employed to produce a near planar wave front across the desired test volume. In another embodiment, an antenna and reflector combination may be arranged such that the feed antenna is to the side and does not block the signal in the desired propagation direction. The antenna and reflector combinations can be single or dual polarized. The plane wave generating antennas may be adjusted to support any desired non-planar propagation to simulate reflections at a shorter distance. A plurality of such arrays arranged around the DUT may be provided in order to simulate multiple plane waves impinging on the device from multiple directions, or to measure signals radiated from the device in multiple directions.

A high density antenna array with a channel emulation and feed system capable of generating any desired signal within the test volume may be achieved by feeding each array element on a surface surrounding the DUT (e.g. a sphere) with the necessary magnitude and phase to replicate the desired plane waves in all required directions simultaneously. The individual antenna elements are no longer just simulating a single propagation direction, but are now part of a larger array that when combined with the target channel models can accomplish the target environment simultaneously.

Figure 2:
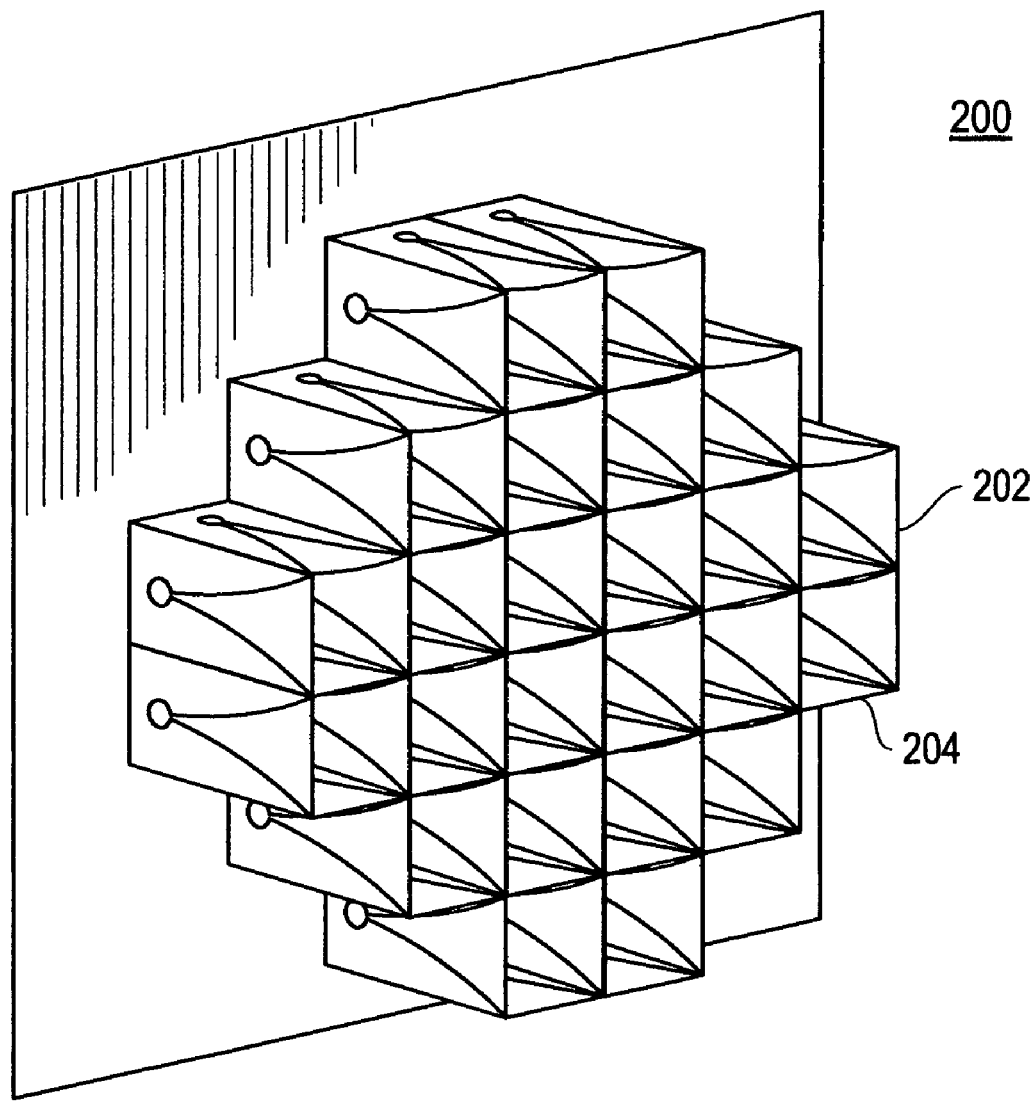
FIG. 2 depicts an array of sub-antennas.

FIG. 2 depicts an array 200 of antenna elements 202 and 204 that may be adapted to produce substantially plane waves at a wireless device under test in an anechoic chamber. Thus, one embodiment includes a one or two dimensional array of broadband or narrowband antenna elements. The excitation of the antenna elements of the array may be phased to form a phased array that produces a near planar wave front across a desired test volume where is located a device to be tested. The array may comprise single or dual polarized antenna elements.

Figure 3:
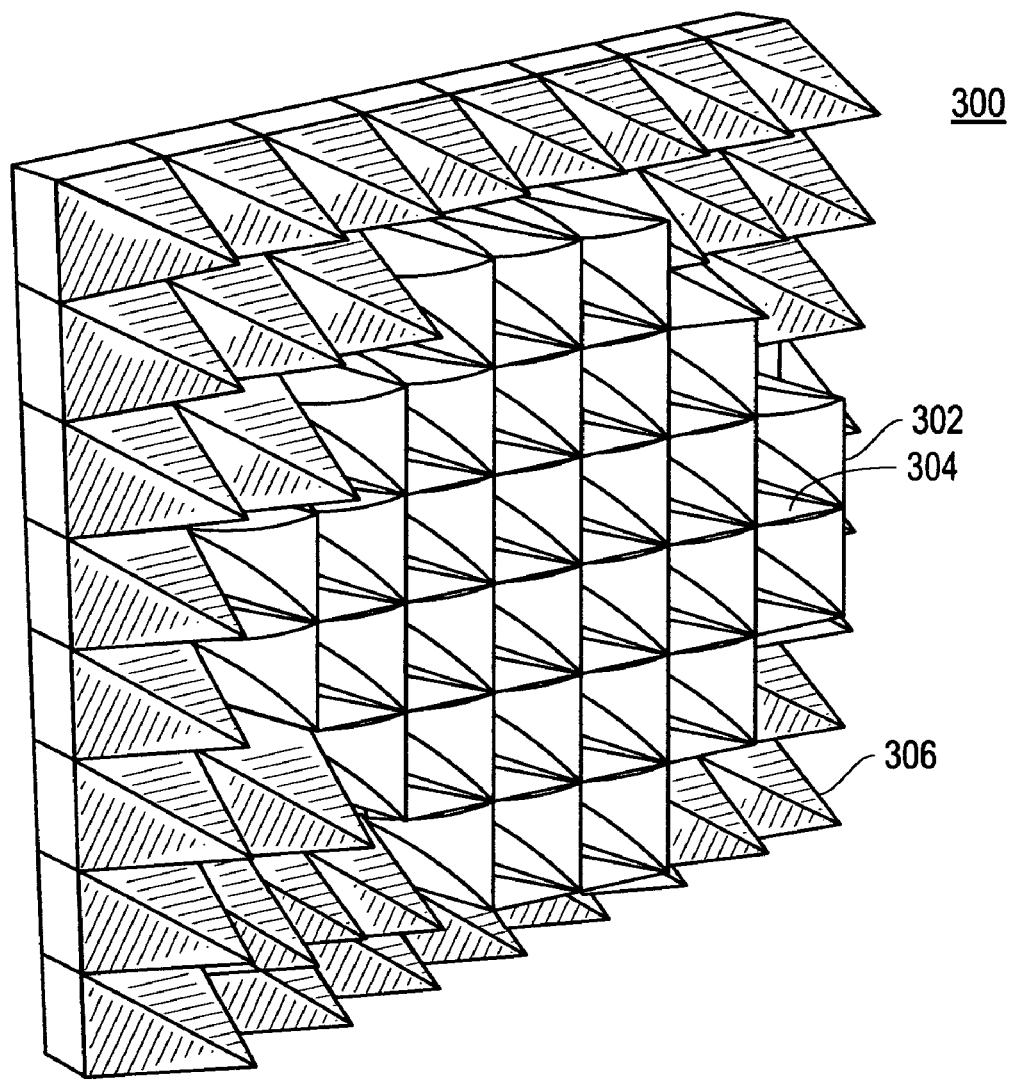
FIG. 3 depicts an array of sub-antennas encompassed by absorber material.

FIG. 3 depicts an array 300 of antenna elements 302 and 304 encompassed by absorber material 306 that may be adapted to produce substantially plane waves at a device under test in an anechoic chamber. The absorber material reduces undesirable side lobes and inter-element coupling.

Figure 4:
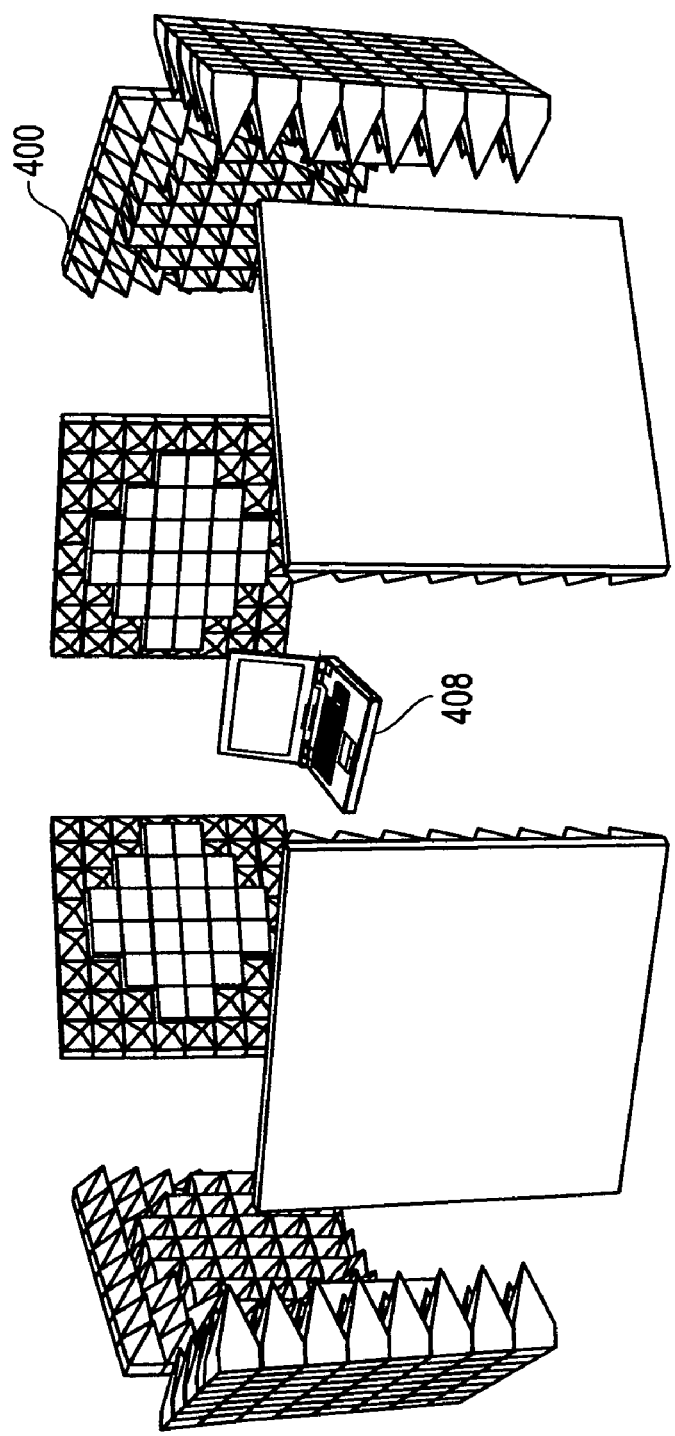
FIG. 4 depicts a plurality of arrays around a device under test.

FIG. 4 depicts a plurality of arrays 400 around a device under test 408, wherein each array may be adapted to produce substantially plane waves at the device under test.

Figure 5:
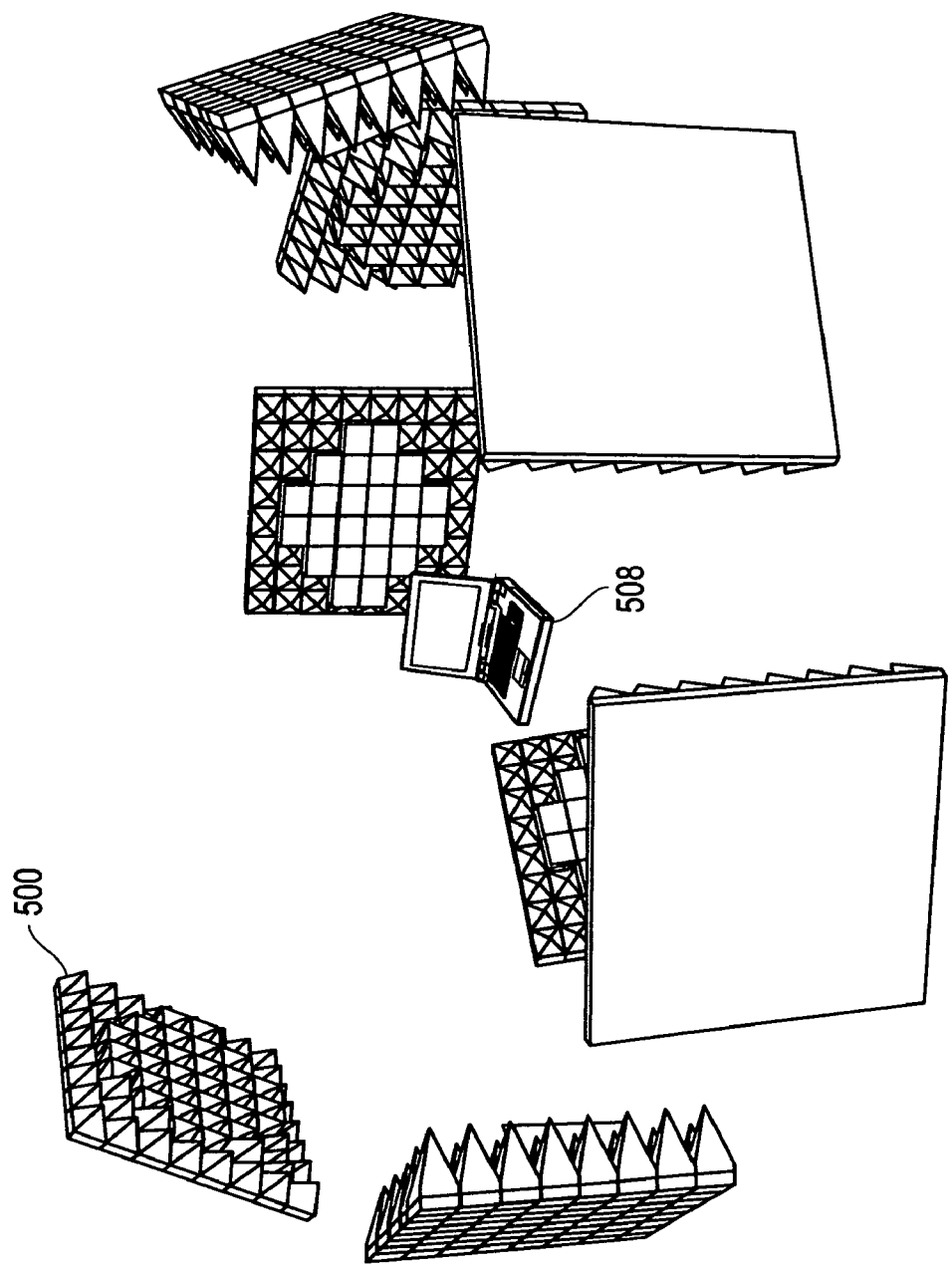
FIG. 5 depicts a plurality of arrays around a device under test, the arrays not all lying in a common plane.

FIG. 5 depicts a plurality of arrays 500 around a device under test 508, the arrays not all lying in a common plane. Thus, the arrays may produce substantially plane waves from any number of desired angles to test the device.

Figure 6:
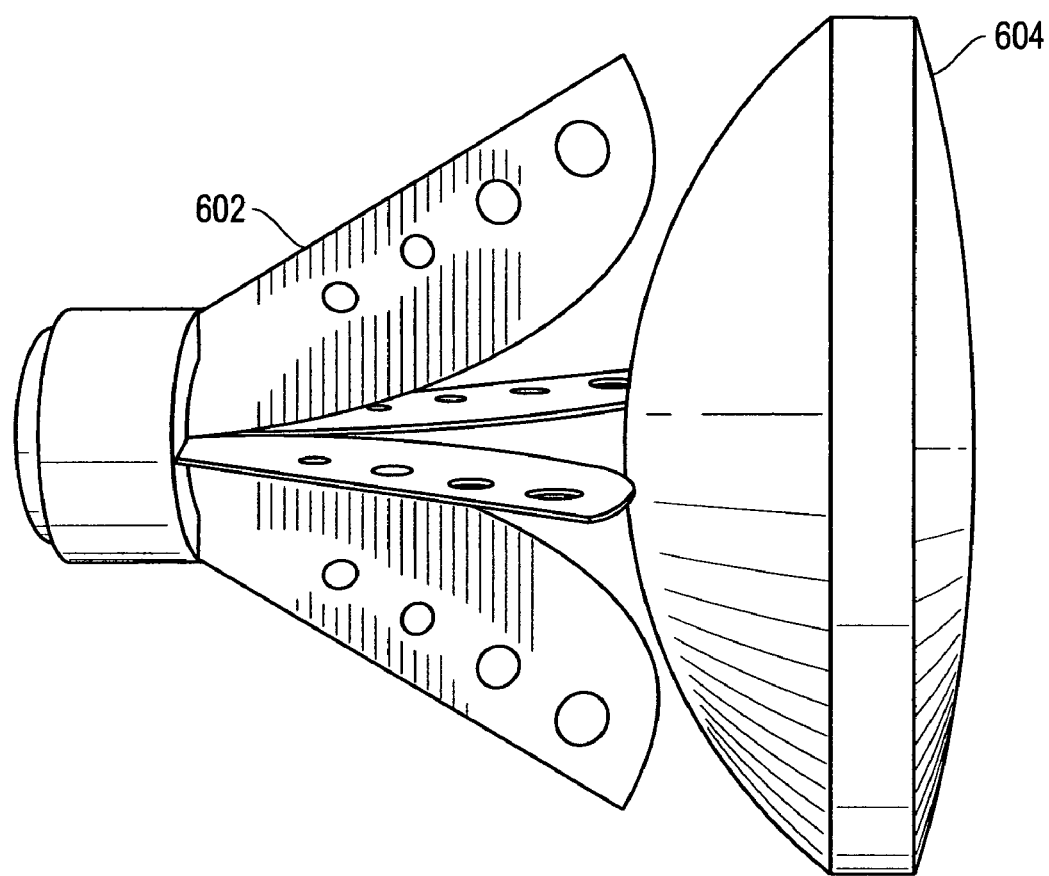
FIG. 6 depicts an antenna with a dielectric lens.
Figure 7:
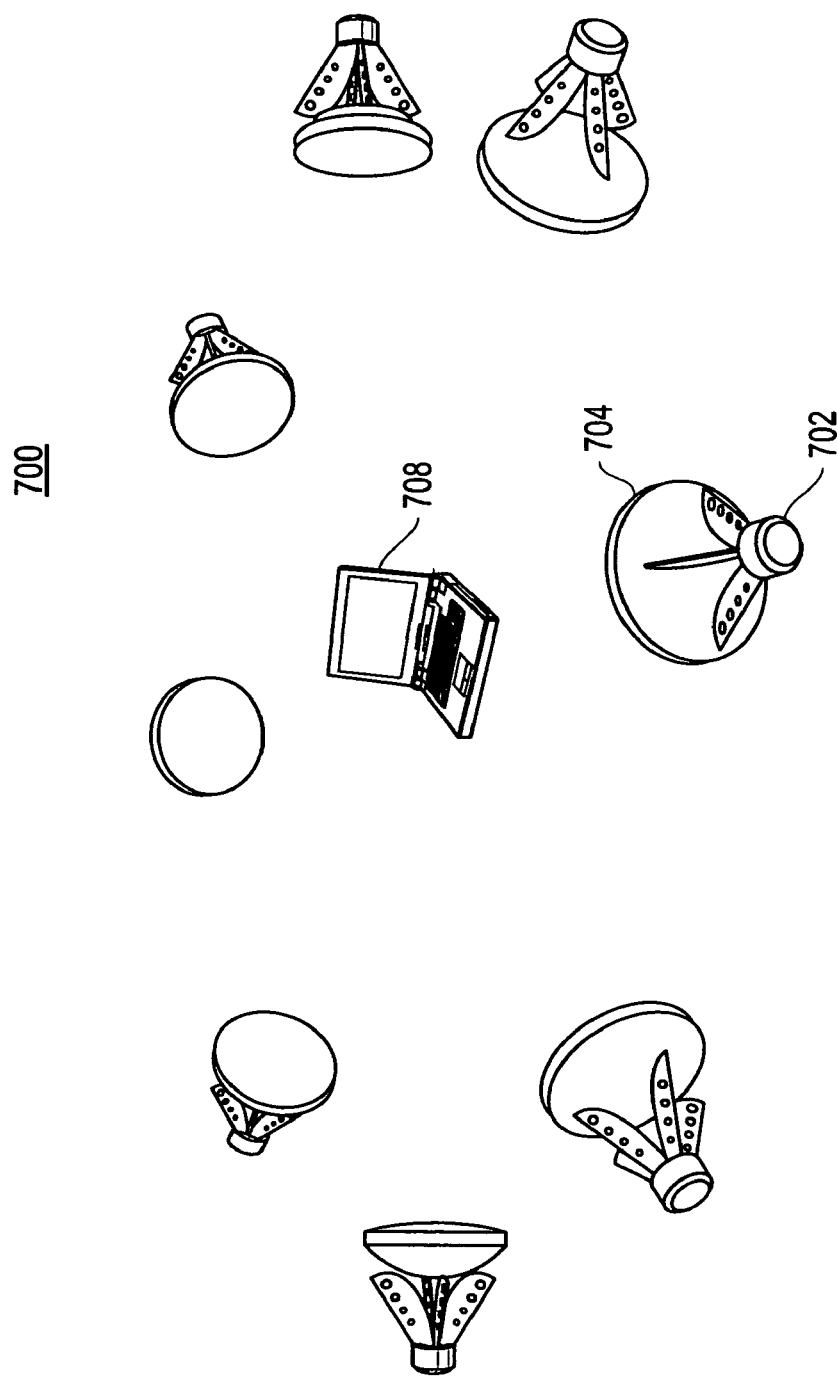
FIG. 7 depicts a plurality of antennas with dielectric lenses around a device under test.

FIG. 6 depicts an antenna 600 with an antenna element 602 with a dielectric lens 604 adapted to produce substantially plane waves at a device under test. The antenna of FIG. 6 is a dual-polarized horn antenna, but other types of antennas may be employed. FIG. 7 depicts a plurality of antennas 700 with elements 702 with dielectric lenses 704 around a wireless device under test 708, each antenna—with dielectric lens—adapted to produce substantially plane waves at the device under test.

Figure 8:
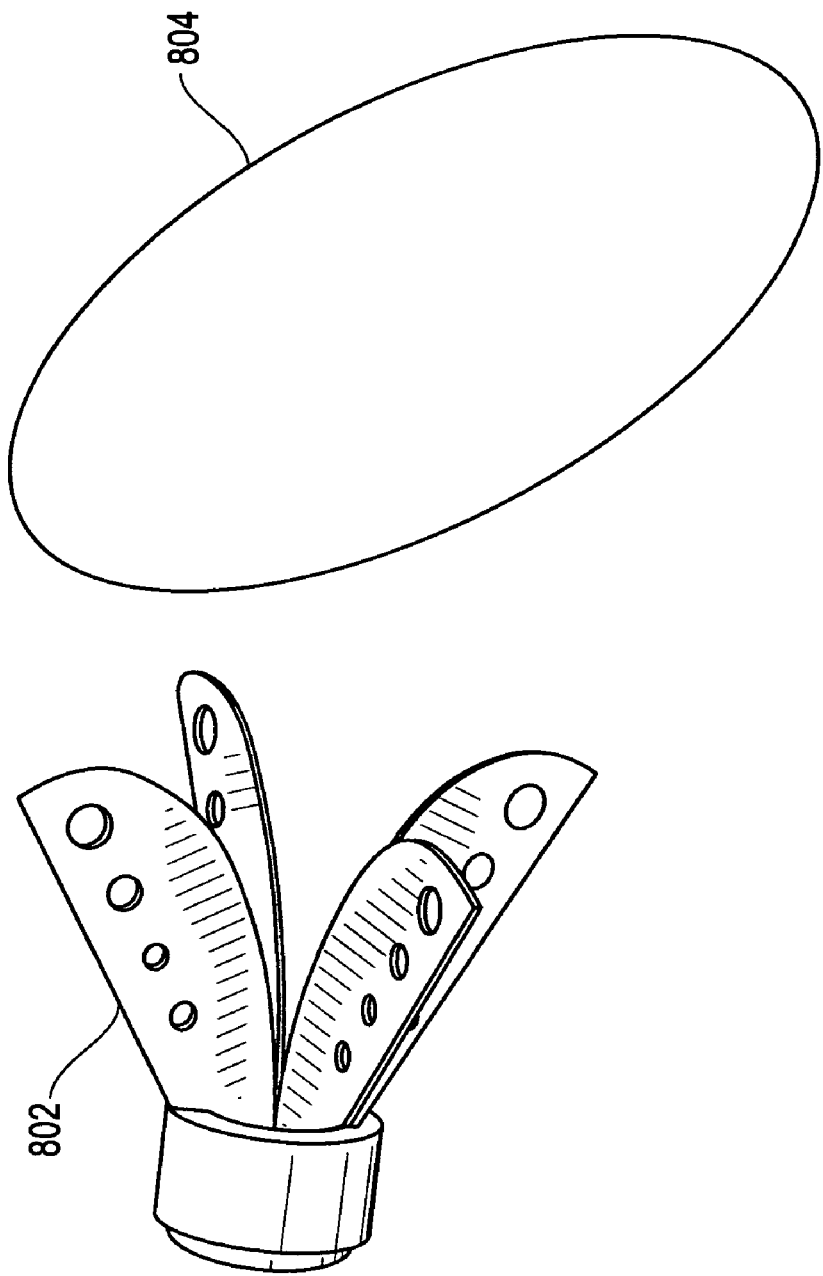
FIG. 8 depicts an antenna with a parabolic reflector.
Figure 9:
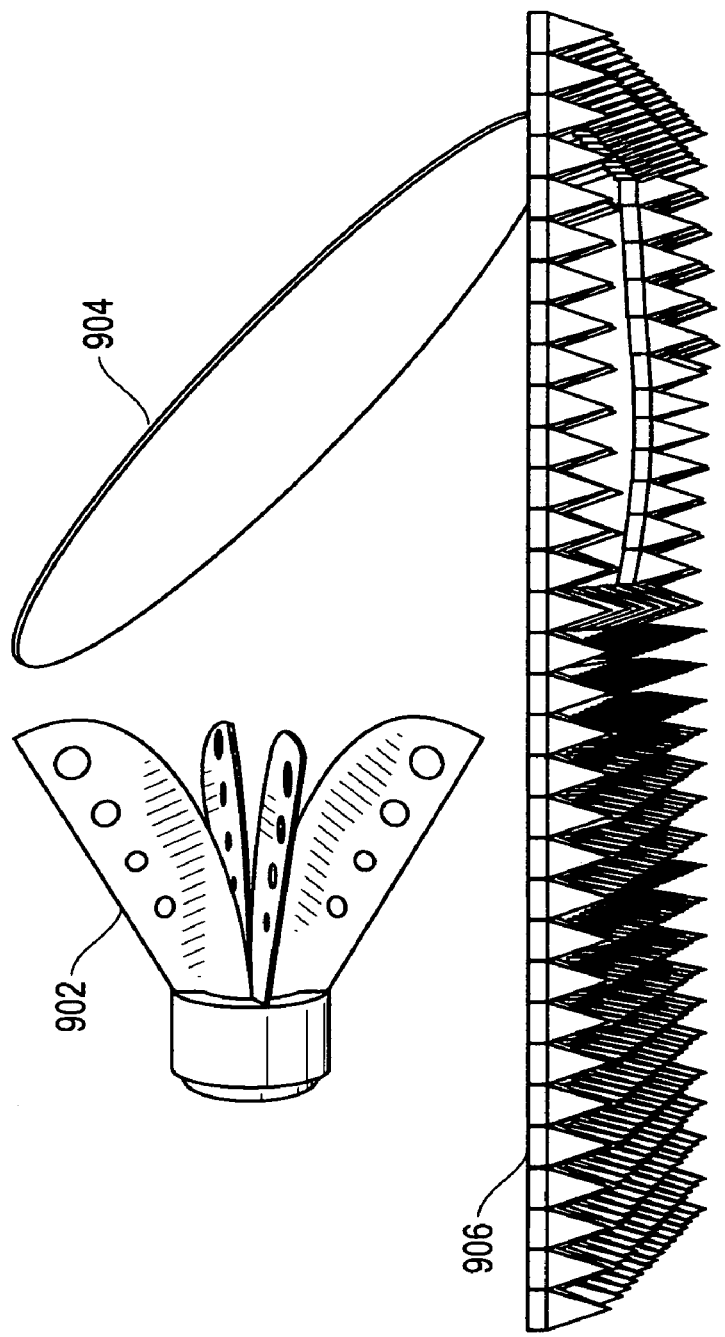
FIG. 9 depicts an antenna with a parabolic reflector positioned behind absorber material.

FIG. 8 depicts an antenna element 802 with a parabolic reflector 804 to adapt the antenna element 802 to produce substantially plane waves at a device under test. The parabolic reflector causes the antenna to appear to be much further away from the device under test than it actually is. The parabolic reflector may also change the direction of a main beam of the antenna element 802. FIG. 9 depicts an antenna element 902 with a parabolic reflector 904 positioned behind absorber material 906, thereby shielding a DUT from energy that would otherwise be reflected from the antenna element 902 and thereby shielding the DUT from side lobes of the antenna. The parabolic reflector 904 causes a horizontal main beam of the antenna element 902 to deflect downward in a vertical direction through an opening in the absorber material 906. Thus, in a particular illustrative embodiment, a horn or other directional antenna with an appropriate reflector (parabolic, etc.) is employed to produce a near planar wave front across the desired test volume. In another embodiment, an antenna and reflector combination may be arranged such that the feed antenna is to the side and does not block the signal in the desired propagation direction. The antenna and reflector combinations can be single or dual polarized.

The plane wave generating antennas may be adjusted to support any desired non-planar propagation to simulate reflections at a shorter distance. A plurality of such arrays arranged around the device under test (DUT) may be provided in order to simulate multiple plane waves impinging on the device from multiple directions, or to measure signals radiated from the device in multiple directions.

Embodiments and some of their advantages have been described in detail. It should be understood that various changes, substitutions and alterations can be made herein without departing from the scope of the appended claims. An embodiment may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. One of ordinary skill in the art will readily appreciate from the present disclosure that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A method of simulating a multipath environment, the method comprising:
   placing a plurality of antennas at various angles around a test position within an anechoic chamber, the plurality of antennas adapted to produce substantially plane waves at the test position;
   connecting the plurality of the antennas to a variable path simulator having multiple separate paths to introduce user-defined delay spreads into each path connected to an antenna, wherein each path of the variable path simulator is coupled to a different one of the plurality of antennas; and
   receiving or transmitting by the plurality of antennas, a plurality of signals, each signal associated with a different one of the plurality of antennas, and wherein each signal propagates through a separate one of the multiple separate paths of the variable path simulator to enable simulation of reflections and interference sources at different angles and distances.

2. The method of claim 1, wherein the plurality of antennas do not lie in a common plane.

3. The method of claim 1, wherein the plurality of antennas is adapted to produce substantially plane waves at the test position by placing a waveguide-less dielectric lens in a path of a main beam of the antenna.

4. The method of claim 1, wherein at least one antenna of the plurality of antennas is adapted to produce substantially plane waves at the test position by placing a reflector in a path of a main beam of the antenna.

5. The method of claim 4, wherein at least one antenna of the plurality of antennas is placed behind absorbing material and a parabolic reflector redirects a main beam of the antenna past the absorbing material.

6. The method of claim 1, wherein the plurality of antennas are grouped into a plurality of separately excited phased arrays positioned about the test position.

7. The method of claim 6, wherein the edges of each array are encompassed with absorbing material.

8. The method of claim 6, wherein each of the phased arrays is an array of at least 8 integrated flared notch antenna elements.

9. A test system for testing a device in a multipath environment, the test system comprising:
   a plurality of antennas disposed at various positions around a test position within an anechoic chamber, the plurality of antennas adapted to produce substantially plane waves at the test position; and
   a variable path simulator with different paths connected to different ones of the plurality of antennas to introduce a different delay spread into each path connected to an antenna;
   wherein the positions of the antennas and the delays introduced by the variable path simulator enable simulation of electromagnetic fields from reflections and interference sources at different angles and distances.

10. The test system of claim 9, wherein at least one of the plurality of antennas is an array of at least 8 integrated flared-notch antenna elements encircled by absorbing material.

11. The test system of 10, wherein the flared-notch antenna elements are arranged to provide dual polarization.

12. The test system of claim 9, wherein at least one antenna of the plurality of antennas is a horn antenna adapted to produce substantially plane waves by placing a waveguide-less dielectric lens in a path of a main beam of the horn antenna.

13. The test system of claim 9, wherein at least one of the plurality of antennas is a horn antenna adapted to produce substantially plane waves by placing a parabolic reflector in a path of a main beam of the horn antenna.

14. The test system of claim 13, further comprising absorbing material positioned between a horn antenna and the test position.

15. A system for simulating a multi-path environment, the system comprising:
   a plurality of antennas adapted to produce substantially plane waves at a test position;
   a simulator to simulate a plurality of spatial paths, each spatial path coupled to a different one of the plurality of antennas,
   a Multiple Input Multiple Output (MIMO) tester to measure a signal in each of M emulated channels coupled to N spatial paths of the simulator, where M and N are integers.

16. The system of claim 15, wherein the plane-wave-producing antennas are configured to produce a non-plane wave at the test position.

17. The system of claim 15, wherein at least one of the plurality of antennas is a phased array of antenna elements.

18. The system of claim 15, wherein at least one antenna of the plurality of antennas includes a waveguide-less dielectric lens in a path of a main beam of the at least one antenna.

19. The system of claim 15, wherein at least one antenna of the plurality of antennas includes a reflector in a path of a main beam of the antenna.

* * * * *